(12) United States Patent
Jech, Jr. et al.

(10) Patent No.: US 6,426,237 B2
(45) Date of Patent: *Jul. 30, 2002

(54) METHOD FOR PRODUCING OPTICALLY PLANAR SURFACES FOR MICRO-ELECTROMECHANICAL SYSTEM DEVICES

(75) Inventors: Joseph Jech, Jr., Rochester; John A. Lebens, Rush; John C. Brazas, Jr., Hilton; Marek W. Kowarz, Rochester, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/867,928

(22) Filed: May 30, 2001

Related U.S. Application Data (63) Continuation-in-part of application No. 09/215,973, filed on Dec. 18, 1998, now Pat. No. 6,284,560.

(51) Int. Cl.⁷ .............................................. H01L 21/302
(52) U.S. Cl. ........................................ 438/48; 438/692
(58) Field of Search .......................... 438/48, 192, 488, 438/693, 959, 974, 946; 216/2, 88, 89, 39

(56) References Cited

U.S. PATENT DOCUMENTS

| | | |
|---|---|---|
| 4,789,648 A | 12/1988 | Chow et al. |
| 4,944,836 A | 7/1990 | Beyer et al. |
| 4,954,142 A | 9/1990 | Carr et al. |
| 5,173,439 A | 12/1992 | Dash et al. |
| 5,311,360 A | 5/1994 | Bloom et al. |
| 5,663,107 A | 9/1997 | Peschke et al. |
| 5,721,172 A | 2/1998 | Jang et al. |
| 5,804,084 A | 9/1998 | Nasby et al. |
| 5,899,713 A | 5/1999 | Acocella et al. |
| 5,904,558 A | 5/1999 | Suzuki |
| 5,923,993 A | 7/1999 | Sahota |
| 5,948,698 A | 9/1999 | Inohara et al. |
| 5,948,700 A | 9/1999 | Zheng et al. |
| 5,958,795 A | 9/1999 | Chen et al. |
| 5,976,982 A | 11/1999 | Levy et al. |
| 6,001,730 A | 12/1999 | Farkas et al. |
| 6,004,653 A | 12/1999 | Lee |
| 6,017,803 A | 1/2000 | Wong |
| 6,020,265 A | 2/2000 | Lou |
| 6,022,788 A | 2/2000 | Gandy et al. |
| 6,033,961 A | 3/2000 | Xu et al. |
| 6,048,771 A | 4/2000 | Lin et al. |

FOREIGN PATENT DOCUMENTS

| | | |
|---|---|---|
| EP | 0 670 591 A2 | 3/1995 |
| FR | 2 599 892 | 6/1986 |

OTHER PUBLICATIONS

Roh et al., Easily Manufacturable Shallow Trench Isolation for Gigabit Dynamic Random Access Memory, *Japanese Journal Appl. Phys.*, vol. 35, 1996, pp. 4618–4623.

U.S. application No. 09/216,202, Hawkins et al., filed Dec. 18, 1998, now granted as US Patent 6,238,581, to be issued May 29, 2001.

U.S. application No. 09/491,354, Kowarz, filed Jan. 26, 2000, now issued as US 6307663.

*Primary Examiner*—Savitri Mulpuri
(74) *Attorney, Agent, or Firm*—Stephen H. Shaw (57) ABSTRACT

A method for producing optically planar surfaces for micro-electromechanical system devices (MEMS), comprising the steps of: depositing a first layer over a substrate; forming a channel in the first layer wherein the channel has a depth defined by a thickness of the first layer and a width greater than 10 microns; depositing a second layer over the first layer wherein the second layer has a thickness greater than the depth of the channel and is composed of a different material than the first layer; removing the second layer from outside the channel leaving an overlap at the edge of the channel; and polishing the second layer that fills the channel to obtain an optically planar surface for the MEMS device.

30 Claims, 13 Drawing Sheets

METHOD FOR PRODUCING OPTICALLY PLANAR SURFACES FOR MICRO-ELECTROMECHANICAL SYSTEM DEVICES

CROSS REFERENCE TO RELATED APPLICATION

This is a continuation-in-part of U.S. application Ser. No. 09/215,973, filed Dec. 18, 1998, now U.S. Pat. No. 6,284,560, by Jech Jr. et al., entitled *Method for Producing Co-Planar Surface Structures*.

FIELD OF THE INVENTION

This invention relates to micro-electromechanical devices, and more particularly to the optical planarity of micro-electromechanical device gratings.

BACKGROUND OF THE INVENTION

Micro-electromechanical spatial light modulators with a variety of designs have been used in applications such as display optical processing, printing, optical data storage and spectroscopy. These modulators produce spatial variations in the phase and/or amplitude of an incident light beam using arrays of individually addressable devices.

Chemical mechanical planarization (CMP) has become a key technology as currently practiced in the semiconductor art, for the planarization of metals and dielectrics. In micromachining, the same technique can be used on a fill layer to obtain flat surfaces. However, many of the micromachined structures typically fall into the regime of wide (>10 μm wide) recesses and sparsely populated structures. One of the difficulties encountered with CMP planarization is the "dishing" effect which occurs in the planarization of wide recesses. The "dishing" effect during planarization results in thinning of a fill layer in wide recesses and a non-planar surface. The polish rate is affected by the topology of the surrounding areas with dishing becoming worse in sparsely populated regions. Therefore, dishing problems present a severe manufacturing constraint in micromachining.

Non-uniform removal of a fill material across the wafer is also an important consideration in micromachining. When a fill layer is a sacrificial layer, it must be removed outside of the active regions in order to assure adhesion of the release layers. Any residual sacrificial material outside of the active region will be attacked during release. Conventional polishing that ensures complete removal of a sacrificial layer outside of the active region will cause over-polishing and excess removal of the sacrificial material in the active regions.

Figure 1A:
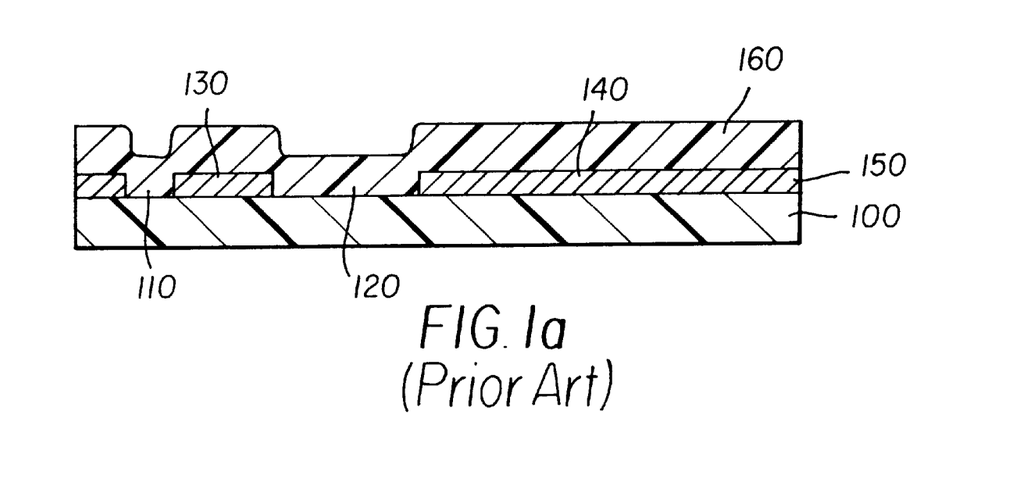
FIGS. 1a–b show the dishing phenomenon reference to the schematic cross-sectional views of multilayered structures.
Figure 1B:
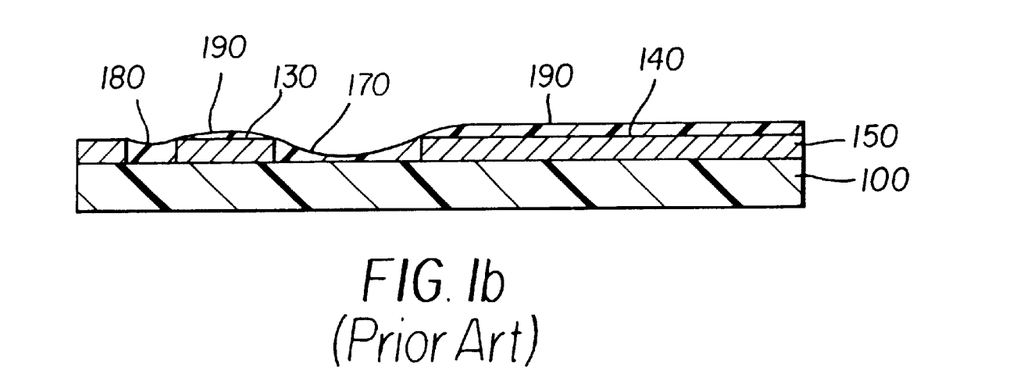

The dishing phenomenon is illustrated by reference to the schematic cross-sectional diagrams of FIG. 1a and FIG. 1b. Shown in FIG. 1a, is a substrate 100 onto which a first layer 150 is deposited. A narrow recess 110 and the wide recess 120 are shown formed in the first layer 150. The surface of the first layer 150 will contain small areas 130 between recesses and large areas 140 between recesses 110 and 120. Deposited over the first layer 150 and into both the narrow recess 110 and the wide recess 120 is a blanket conformal fill layer 160. Shown in FIG. 1b are the results of planarizing through a conventional chemical mechanical planarization (CMP) method and the blanket conformal fill layer 160 as illustrated in FIG. 1a. As shown in FIG. 1b, the surface of the planarized filled wide recess 170 is severely dished in comparison with the surface of planarized filled narrow recess 180. This marked contrast most resembles the large differences in the problems addressed by the semi-conductor industry versus those skilled in micro-electromechanical systems. Planarized filled narrow recess 180 has the narrow dishing experience in the semi-conductor industry, while planarized wide recess 170 has the complications experienced by the MEMS skilled artisans. A self-aligned mask formed by CMP and used within the severely dished planarized wide recess 170 would be completely polished away in any attempt to address the dishing phenomenon.

There is also shown in FIG. 1b the presence of a fill residue layer 190, formed simultaneously over the small areas 130 and large areas 140 on the surface of the first layer 150 when the blanket conformal fill layer 160 is planarized through the chemical mechanical planarization (CMP) method to form the planarized filled recesses 180 and 170. As is understood by a person skilled in the art, when planarizing large areas of the blanket conformal fill layer 160, generally of dimensions greater than about 1000 microns, the blanket conformal fill layer 160 will in addition to planarizing more rapidly over the wide recess 120 and forming a dish within the planarized filled wide recess 170, simultaneously also polish more slowly over the large area 140 on the surface of the first layer 150 and leave the fill residue layer 190 formed over the large area 140 on the first layer 150. Attempts to remove the fill residue layer 190 by further planarization will cause increased dishing of the planarized filled recesses 180 and 170. Fill residue layers such as the fill residue layer 190 are undesirable since they impede further device processing on the planarized surface. Fill residue layers also impede ribbon attachment to end supports in electromechanical grating structures.

What is needed is a method to create an optically planar surface on the fill layer while eliminating any fill residue layers.

SUMMARY OF THE INVENTION

The need is met according to the present invention by providing a method for producing optically planar surfaces for micro-electromechanical system devices (MEMS), comprising the steps of: depositing a first layer over a substrate; forming a channel in the first layer wherein the channel has a depth defined by a thickness of the first layer and a width greater than 10 microns; depositing a second layer over the first layer wherein the second layer has a thickness greater than the depth of the channel and is composed of a different material than the first layer; removing the second layer from outside the channel leaving an overlap at the edge of the channel; and polishing the second layer that fills the channel to obtain an optically planar surface for the MEMS device.

The present invention achieves technical advantages by intentionally removing the second layer outside of the active regions prior to chemical mechanical polishing.

DETAILED DESCRIPTION OF THE INVENTION

One class of electromechanical spatial light modulators has devices with a periodic sequence of reflective elements that form an electromechanical phase grating made of suspended micromechanical ribbon elements. A method of manufacturing such a device is described in U.S. Ser. No. 09/216,202 filed Dec. 18, 1998 by Hawkins et al., now granted as U.S. Pat. No. 6,238,581, to be issued May 29, 2001. In such devices, the incident light beam is selectively reflected or diffracted into a number of discrete orders. Depending on the application, one or more of these diffracted orders may be collected and used by the optical system. This method described by Hawkins et al. can be fabricated with CMOS-like processes on silicon. The device contains a plurality of spaced apart deformable ribbons that span a channel. Standoffs are patterned in the channel beneath the ribbons to minimize contact area and to obviate stiction between the ribbons and the substrate. Standoffs and also intermediate supports in the channel region will result in some types of topography that are transferred to the surface of the sacrificial layer. It is important that the sacrificial layer upon which the ribbons are deposited become optically planar by removal of any transferred topography. It is also important that the ribbons are securely attached to the end supports.

The grating structure in the above device is defined by the patterning of the ribbon elements. A completely different class of electromechanical grating devices may be obtained by defining a grating structure in the supports below elongated ribbon elements, as disclosed by Kowarz in U.S. Ser. No. 09/491,354 filed Jan. 26, 2000. These devices function on the principle of a hidden grating. In the unactuated state, the grating structure is completely hidden from view and the device functions as a mirror. In the actuated state, the elongated ribbon elements deform to reveal the grating structure of the supports, thus generating a partially conformal diffraction grating. A method for fabricating this conformal Grating Electromechanical System (GEMS) device was disclosed by Kowarz in the Continuation-in-Part application filed on U.S. Ser. No. 09/491,354, filed concurrently. This conformal GEMS device contains elongated deformable ribbons spanning a channel containing a set of intermediate supports. Standoffs are patterned in the channel beneath the ribbons to minimize contact area and to obviate stiction between the ribbons and the substrate. It is important that the sacrificial layer upon which the ribbons are deposited becomes optically flat and coplanar with the intermediate supports. It is also important that the ribbons are securely attached to the end supports.

Figure 2A:
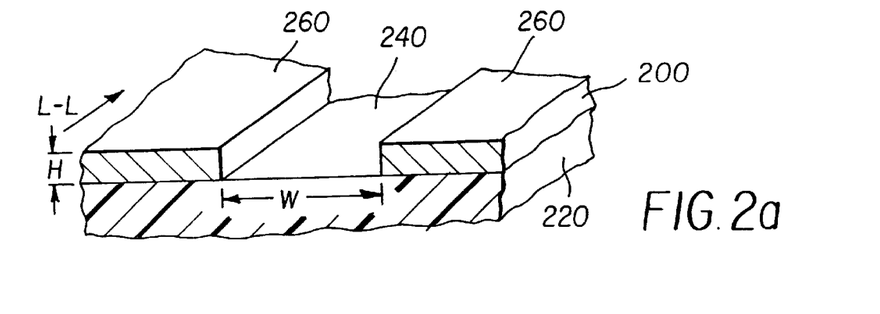
FIGS. 2a–2d are perspective descriptions of the method for producing optically planar surfaces, wherein first fill material is applied to first layer.
Figure 2B:
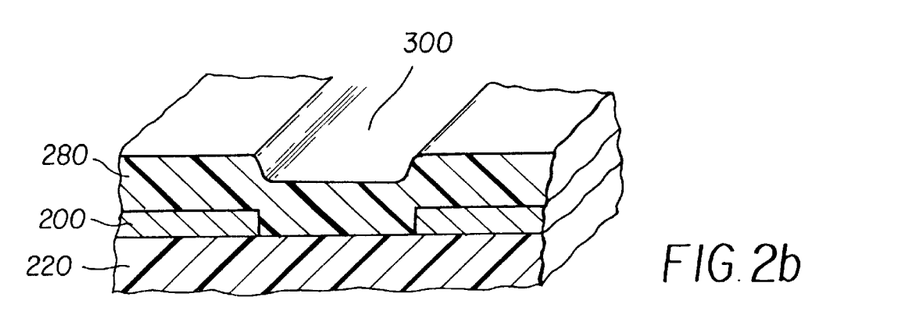
Figure 2C:
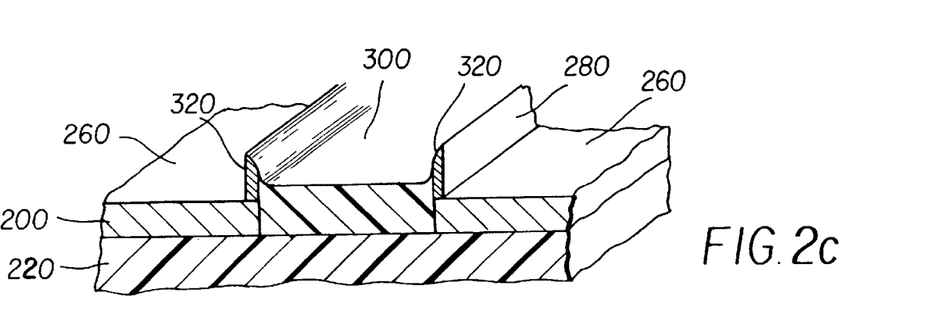
Figure 2D:
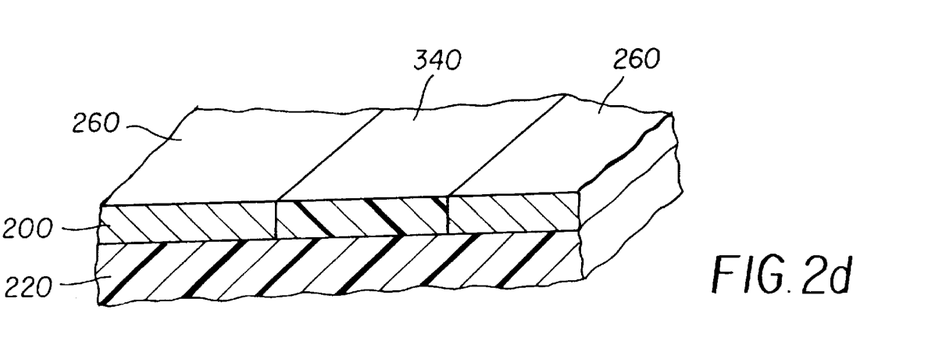

FIGS. 2a through 2d are perspective descriptions of the inventive method for producing at least one optically planar surface. The following description is limited to a device which has a limited number of channels. It is clear for any skilled person that the inventive method is not limited solely to the embodiments disclosed in the specification. According to FIG. 2a, a first layer 200 is provided on a substrate 220 which has a channel 240 formed therein. The first layer 200 also includes a first layer top surface 260. The channel 240 has a width W and a height H which is determined by the thickness of the first layer 200. The channel 240 has a length which extends along the longitudinal axis of the substrate 220. The longitudinal direction of the substrate 220 is marked by an arrow L—L. The channel 240 may include topography. Referring to FIG. 2b, on top of the first layer 200, a second layer 280 that conforms to the first layer 200 is deposited. The thickness of the second layer 280 is at least the height H of the channel 240. The applied second layer 280 defines a conformed channel 300 at the same location as the channel 240 in the first layer 200. The material used for the second layer 280 has to be different from the material of the first layer 200. FIG. 2c shows a first embodiment of the present invention. The selective removal of the second layer 280 is carried out by an appropriate patterning process which is, for example, followed by an etching step. The second layer 280 is removed from everywhere that is unprotected by a patterning or etch mask (not shown). The removal of the second layer 280 exposes the first layer top surface 260. The patterning mask can be biased to provide overlap 320 to account for misalignment. The patterning of the second layer 280 is designed to minimize the width of these overlaps 320 in order to maximize the degree of planarization achieved with the chemical mechanical polishing step described below. The removal of the second layer outside of the channel 240 improves the uniformity of the planarization step described below. This removal process ensures good mechanical attachment of subsequent layers outside the channel 240 region. The second layer 280 can be a sacrificial layer that is completely removed upon completion of the device manufacturing process.

As mentioned above, the device (as shown in FIG. 2c) is subjected to a removing process for the remaining portion of second layer 280. Chemical mechanical polishing methods are used to achieve the polished structure that includes a polished second layer top surface 340. The second layer top surface 340 that fills the channel 240 is preferably polished to be optically planar. As is well known in the practice of optical engineering, this requires a surface planarity of less than about 200 Angstrom units at visible wavelengths. The thickness of the second layer 280 need not be the same as the first layer 200. The thickness of the second layer 280 is closely related to the performance requirements of the micro-electromechanical, "MEMS" device. The surface of the second layer 280 need not be co-planar with the exterior of the device.

Figure 3:
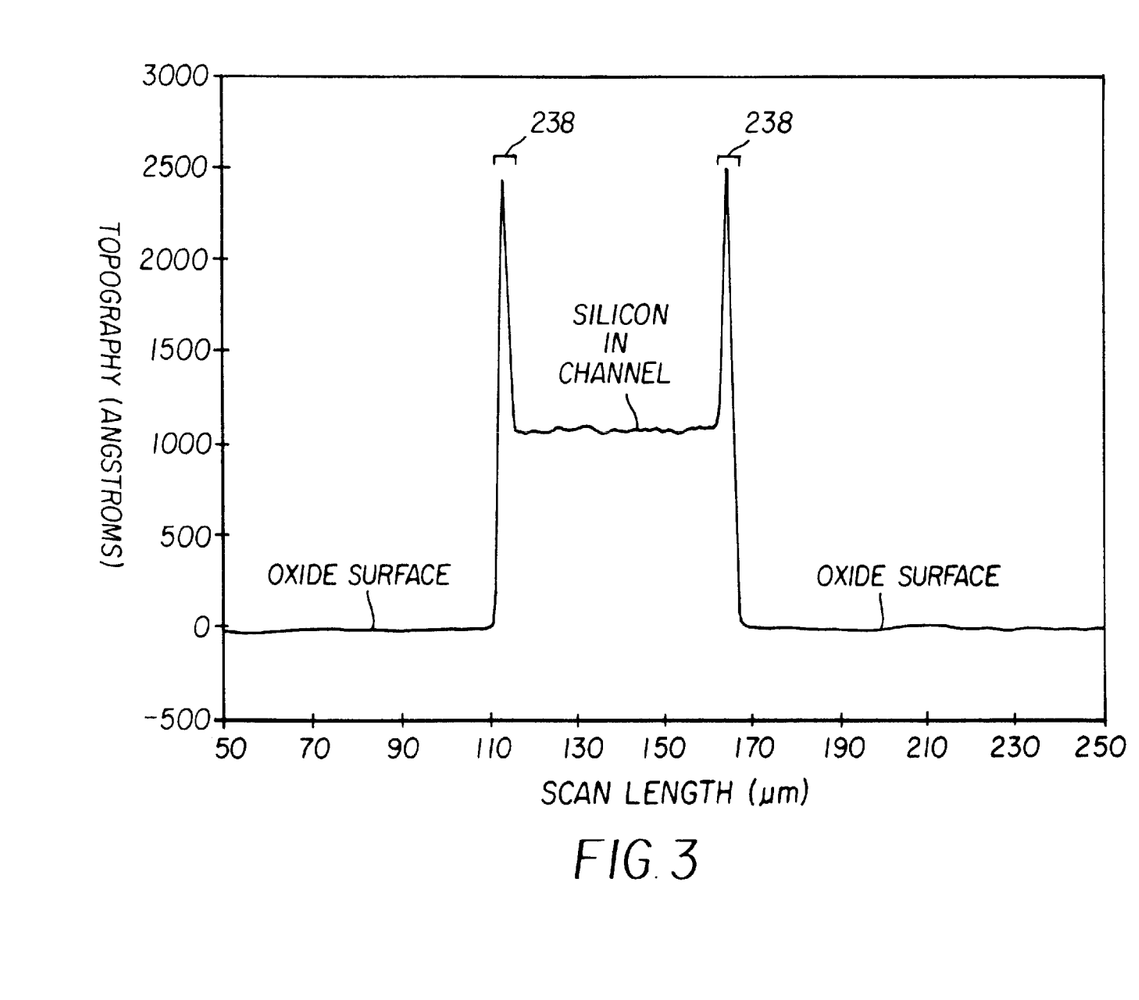
FIG. 3 shows a profilometer trace after the etching of the second layer as disclosed in FIG. 2c.
Figure 4:
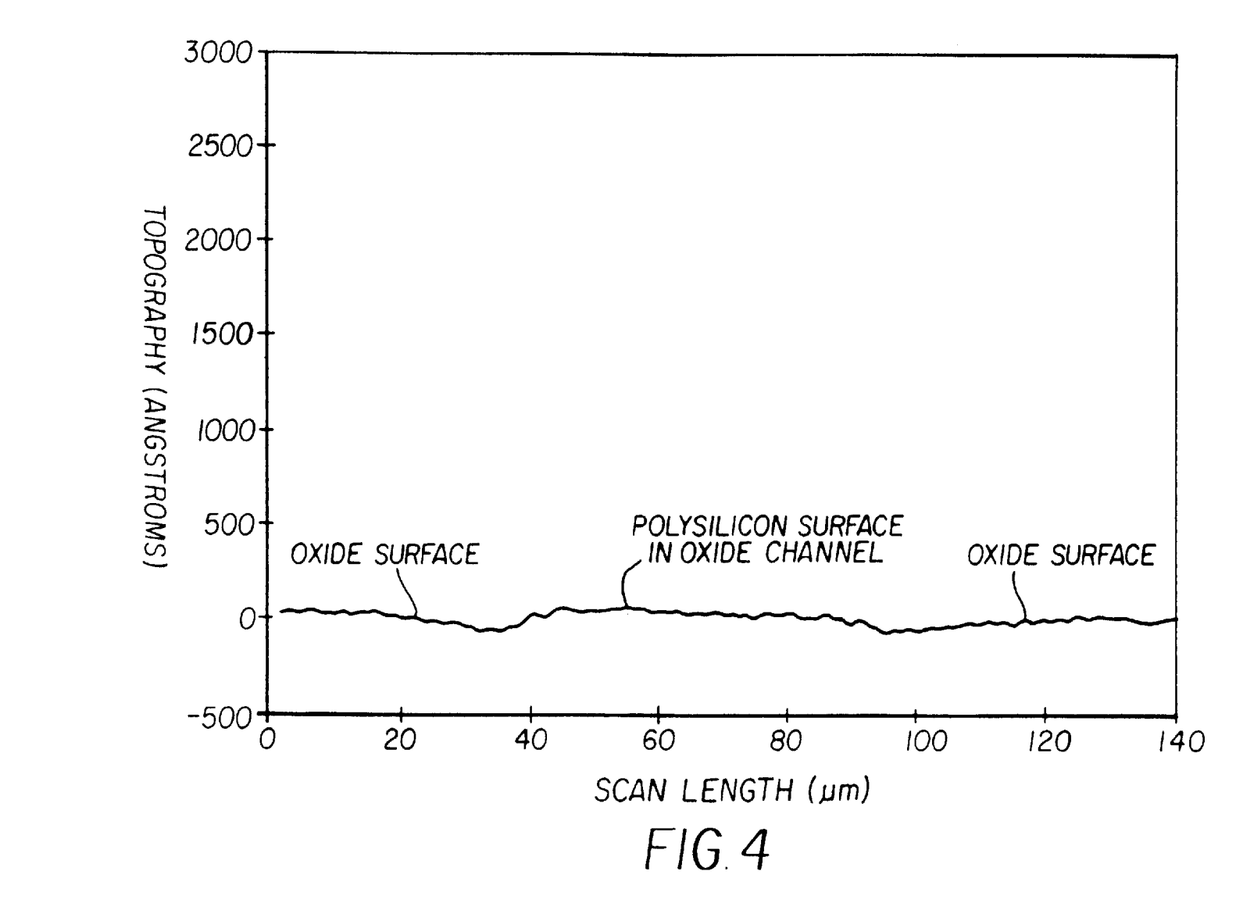
FIG. 4 shows a profilometer trace after the CPM process of the second layer as disclosed in FIG. 2c.
Figure 5:
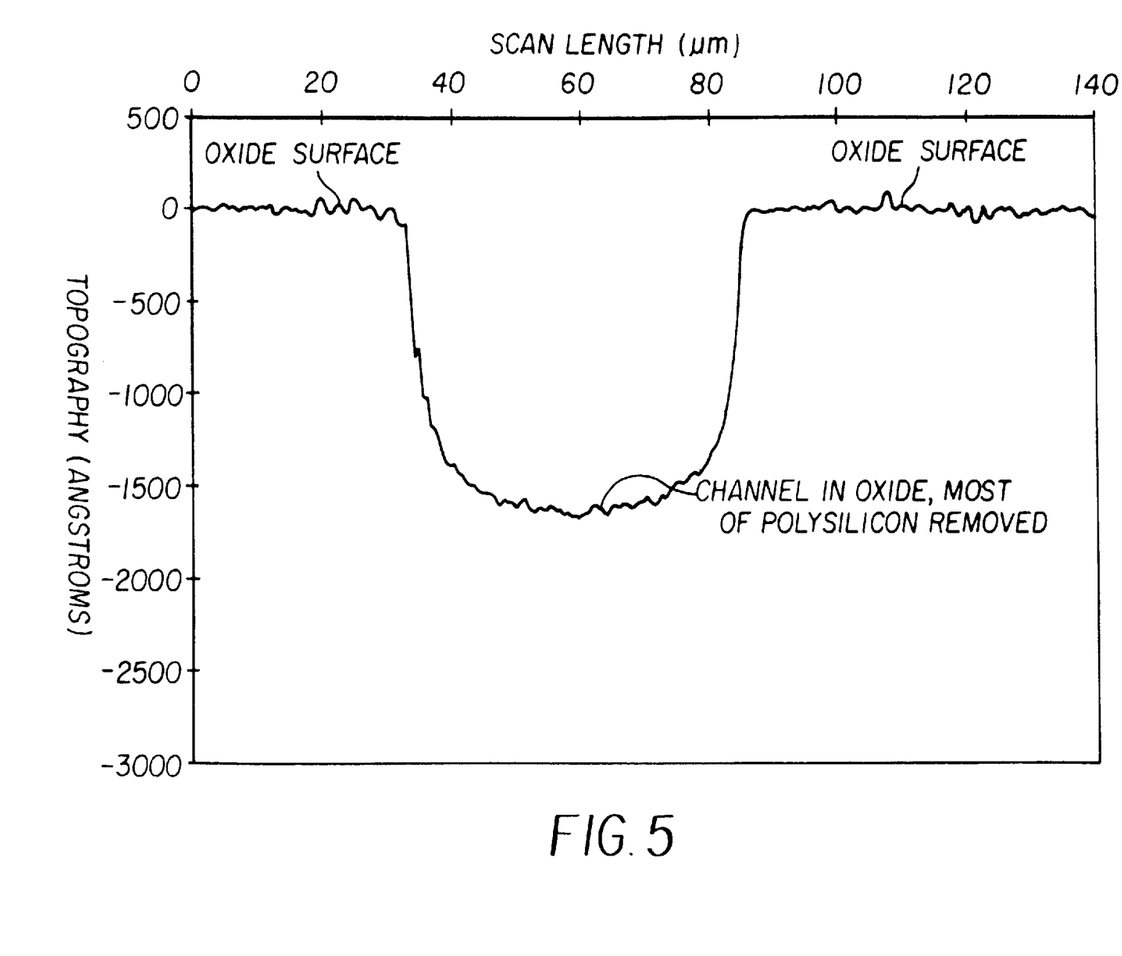
FIG. 5 shows a profilometer trace after the CPM process without patterning as disclosed in FIG. 2c.

FIGS. 3—5 show the improvement of surface quality achieved with the inventive method. The layer structure, used for the topography results, is comparable to the structure as shown in FIG. 2. A first layer 200 of thermally grown silicon dioxide is applied to the substrate 220 and etched to define a 50 μm wide channel 240. A second layer 280 consisting of polysilicon is then deposited. A photoresist is patterned over the polysilicon to serve as an etch mask. The polysilicon is etched away defining a silicon dioxide surface 260 everywhere that is unprotected by the etch mask. In this preferred embodiment the remaining polysilicon layer includes 2 microns of overlap 320 between the polysilicon and silicon dioxide around the channel 240. FIG. 3 shows a surface profilometer trace of such a feature after the photoresist etch mask is removed.

The substrates proceed through a CMP process step. The removal rate of the polysilicon is much greater than the silicon dioxide removal rate, therefore, little oxide is lost; less than 50 Å. The removal rate of the polysilicon on the overlap regions 238 is higher than in the channel regions resulting in an optically planar polysilicon surface. The final thickness of the polysilicon second layer 280 is closely related to the performance requirements of the MEMS device. The thickness of the polysilicon second layer 280 need not be the same as the silicon dioxide first layer 200. Also, the height H2 of the polished polysilicon second layer top surface 340 need not be the same as the height H1 of the silicon dioxide first layer top surface 260.

Since the polysilicon was previously etched away in all other regions of the silicon dioxide, the purpose of the CMP process is limited to just planarizing the channel areas, and not clearing the polysilicon off the silicon dioxide surface. FIG. 4 shows the surface topography around a 50 μm wide channel after CMP. Without patterning the polysilicon first, heavy dishing results, effectively removing the polysilicon from the channel 30 as illustrated in FIG. 5. The processing for both examples included Rodel SDE3000 slurry, Rodel IC1000 pad with a SubaIV subpad on a Strasbaugh 6DS-SP CMP tool. The CMP conditions included a table speed of 55 rpm, spindle speed of 50 rpm, down pressure of 3 PSI, and table temperature of 25° C. It is clear for a skilled person that variations and modifications of the CMP conditions exist.

Figure 6:
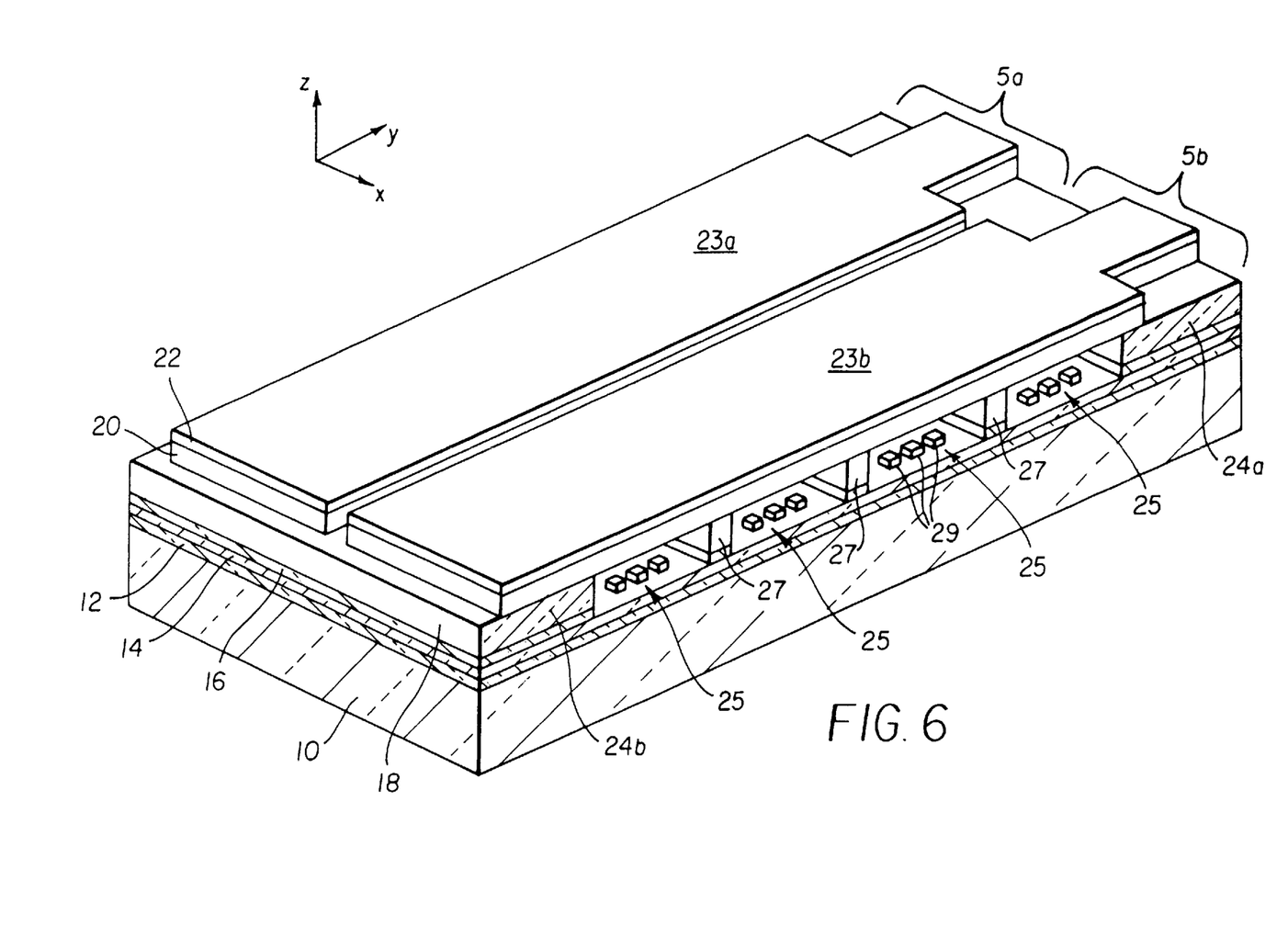
FIG. 6 is a perspective, partial cut-away view of a spatial light modulator with conformal grating electromechanical devices, showing two devices in a linear array.

In another preferred embodiment, that is, a method for producing optically planar free-standing structures; FIG. 6 shows a perspective, partial cut-away view of a spatial light modulator with electromechanical conformal grating devices, disclosing two side-by-side conformal grating devices, 5a and 5b, in an unactuated state. The grating devices 5a and 5b are formed on top of a substrate 10, that is covered by a bottom conductive layer 12 which acts as an electrode to actuate the devices. A dielectric protective layer 14 covers the bottom conductive layer 12. Above the protective layer 14, a standoff layer 16 is formed which is followed by a spacer layer 18. On top of the spacer layer 18, a ribbon layer 20 is formed which is covered by a reflective layer 22.

Each of the two devices 5a and 5b has an associated elongated ribbon element 23a and 23b, respectively, patterned from the reflective and conductive layer 22 and the ribbon layer 20. The elongated ribbon elements 23a and 23b are supported by end supports 24a and 24b, that were formed from the spacer layer 18, and by one or more intermediate supports 27. In FIG. 6, three intermediate supports 27 are shown. These intermediate supports 27 are uniformly separated in order to form four equal-width channels 25. The intermediate supports 27 form a grating structure, for the MEMS device, that is preferably completely hidden from view in an unactuated state and that causes the device to function as a mirror. In the actuated state, the elongated ribbon elements of the MEMS device deform to reveal the grating structure of the intermediate supports 27, thus generating a partially conformal diffraction grating. It is preferable that the elongated ribbon elements 23a and 23b are directly adhered to the end supports and directly adhered to the intermediate supports 27. However, a small gap may actually exist between the intermediate supports 27 and the elongated ribbon elements 23a and 23b. The end supports 24a and 24b are not otherwise defined, other than at their edges that face the channels 25. A plurality of square standoffs 29 is patterned at the bottom of the channels 25 from the standoff layer 16. These standoffs 29 reduce the possibility of the ribbon elements sticking when actuated. The standoffs may also be patterned in shapes other than square, for example, rectangular or round.

Figure 7:
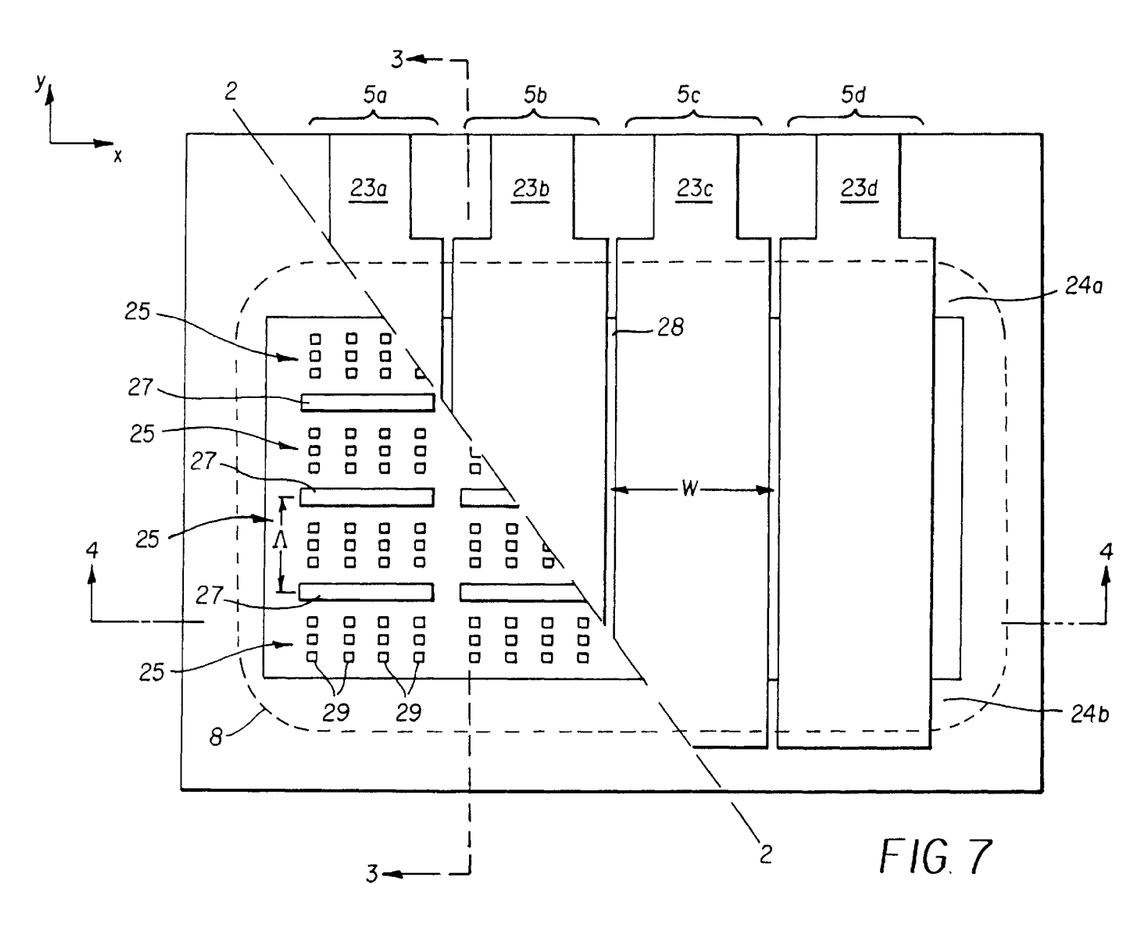
FIG. 7 is a top view of a spatial light modulator with conformal grating electromechanical devices, showing four individually operable devices in a linear array.

A top view of a four-device linear array of conformal grating devices 5a, 5b, 5c and 5d is shown in FIG. 7. The elongated ribbon elements 23a, 23b, 23c, and 23d are depicted partially removed over the portion of the diagram below the line 2—2 in order to show the underlying structure. For best optical performance and maximum contrast, the intermediate supports 27 must be completely hidden below the elongated ribbon elements 23a, 23b, 23c and 23d. Therefore, when viewed from the top, the intermediate supports must not be visible in the gaps 28 between the conformal grating devices 5a–5d. Here each of the conformal grating devices has three intermediate supports 27 with four equal-width channels 25. The active region 8 is the portion of the device where the electromechanical actuation takes place and contains the channels 25, the intermediate supports 27 and the end supports 24a and 24b.

The center-to-center separation A of the intermediate supports 27 or equivalently, the center-to-center separation of the channels 25 of the conformal grating device, wherein a single intermediate support 27 is present, defines the period A of the conformal grating devices in the actuated state. The elongated ribbon elements 23a–23d are mechanically and electrically isolated from one another, thus allowing independent operation of the four conformal grating devices 5a–5d. The bottom conductive layer 12 of FIG. 6 can be common to all of the devices.

Figure 8A:
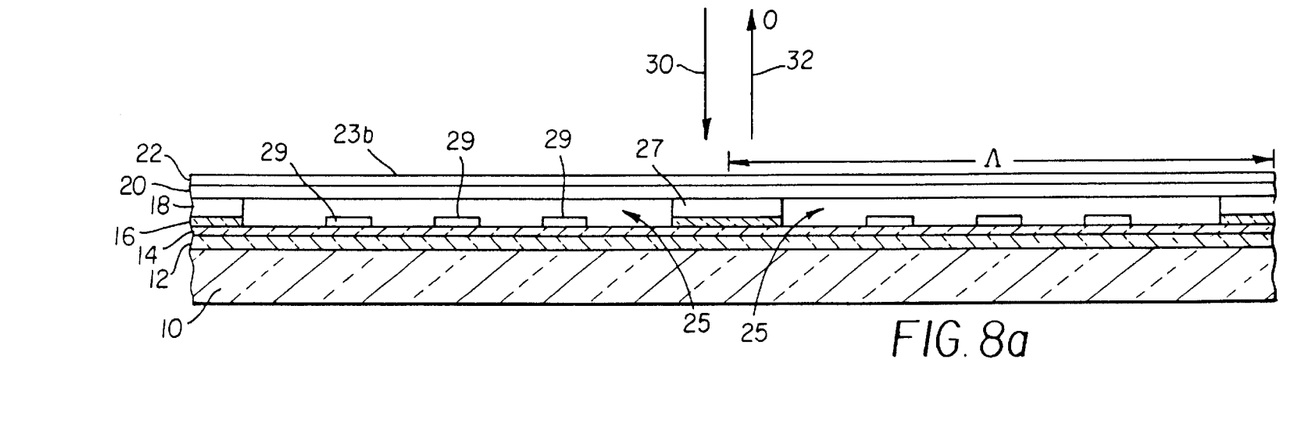
FIGS. 8a and 8b are cross-sectional views through line 3—3 in FIG. 7, showing the operation of an conformal grating electromechanical device in an unactuated state and an actuated state, respectively.
Figure 8B:
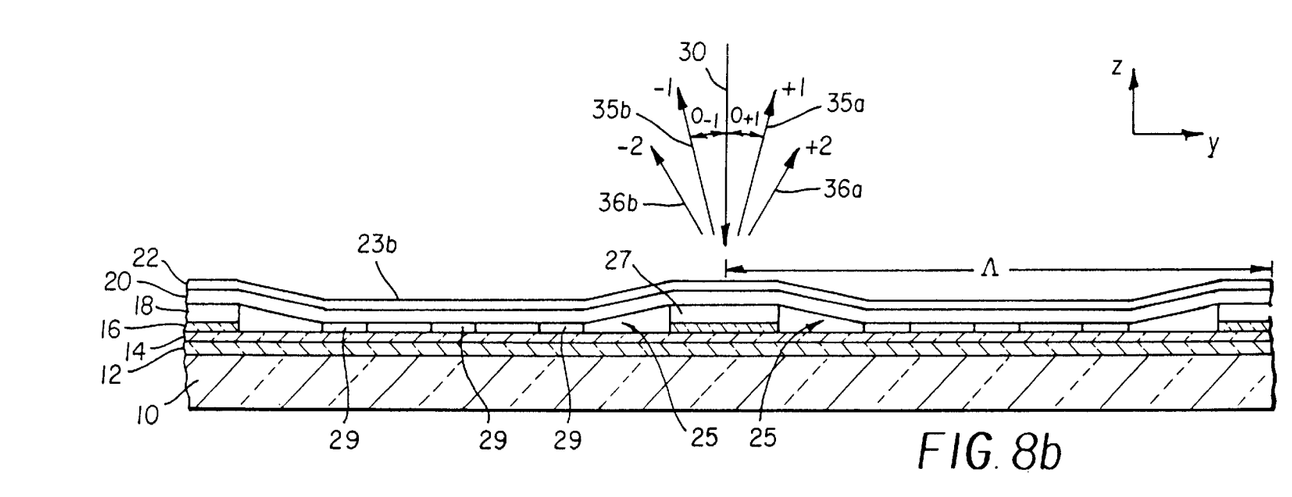

FIG. 8a is a side view, through line 3—3 of FIG. 7, of two channels 25 of the conformal grating device 5b in the unactuated state. FIG. 8b shows the same view of the actuated state. For operation of the device, an attractive electrostatic force is produced by applying a voltage difference between the bottom conductive layer 12 and the conducting layer 22 of the elongated ribbon element 23b. In the unactuated state (see FIG. 8a) with no voltage difference, it is important that the ribbon element 23b is suspended flat between the intermediate supports 27 and the end supports 24a and 24b. In this state, an incident light beam 30 is primarily reflected 32 into the mirror direction. To obtain the actuated state, a voltage is applied to the conformal grating device 5b, deforming the elongated ribbon element 23b to produce a partially conformal grating with period Λ. FIG. 8b shows the device in the fully actuated state with the elongated ribbon element 23b in contact with the standoffs 29. The height difference between the bottom of element 23b and the top of the standoffs 29 is chosen to be approximately ¼ Of the wavelength λ of the incident light. The optimum height depends on the specific shape of the actuated device. Preferably, the height defines the thickness of a sacrificial layer's final composition prior to depositing subsequent layers upon it. In the actuated state, the incident light beam 30 is primarily diffracted into the +1st order 35a and −1st order 35b, with additional light diffracted into the +2nd order 36a and −2nd order 36b. A small amount of light is diffracted into even higher orders and some is reflected. For light incident perpendicular to the surface of the device, the angle θm between the incident beam and the mth order diffracted beam is given by $$\sin \theta_m = m\lambda/\Lambda,$$

where m is an integer. One or more of the diffracted orders can be collected and used by the optical system, depending on the application. When the applied voltage is removed, the forces contributing to tensile stress and bending restore the ribbon element 23b to its original unactuated state.

This example of a spatial light modulator with electromechanical conformal grating is a preferred embodiment for use of the present invention to provide optically planar surfaces. However the present invention is applicable to other electromechanical devices requiring an optically planar surface over topography.

These devices result from a monolithic manufacturing process which is described in greater detail in the Continuation-in-Part application filed on U.S. Ser. No. 09/491,354 by Kowarz, filed concurrently. For discussion purposes, the manufacturing/fabrication process has been simplified herein.

Figure 9A:
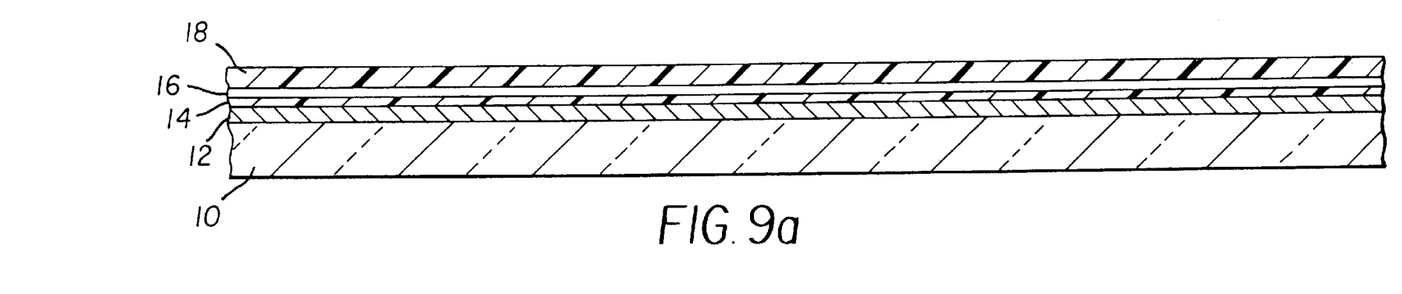
FIG. 9a is a cross-sectional view through line 3—3 in FIG. 7 illustrating the layer structure prior to any patterning.

The fabrication sequence for making a conformal electromechanical grating device is illustrated in FIGS. 9a–9g. Referring to FIG. 9a, the device is built upon a substrate 10, covered by a bottom conductive layer 12, and a protective layer 14 on top of the bottom conductive layer 12. To form standoffs 29 and channels 25, a standoff layer 16 is deposited followed by a spacer layer 18.

Figure 9B:
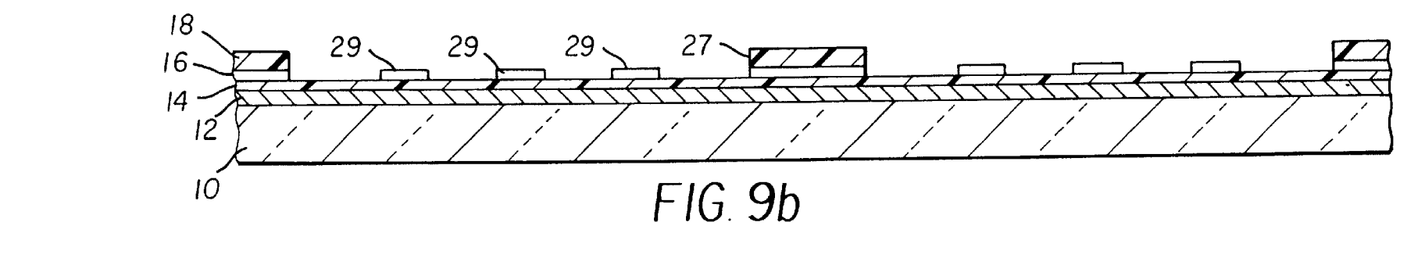
FIG. 9b is a cross-sectional view through line 3—3 in FIG. 7 illustrating patterning of the active region to form channels and intermediate supports.

FIG. 9b, a cross-sectional view along line 3—3 indicated in FIG. 7, illustrates etching of the channels 25 to form the intermediate supports 27. The standoff layer 16 is then patterned using photolithographic processing and etching methods to produce the standoffs 29, as illustrated in FIG. 9b. The standoffs 29 act as mechanical stops for the actuation of the conformal grating device.

Figure 9C:
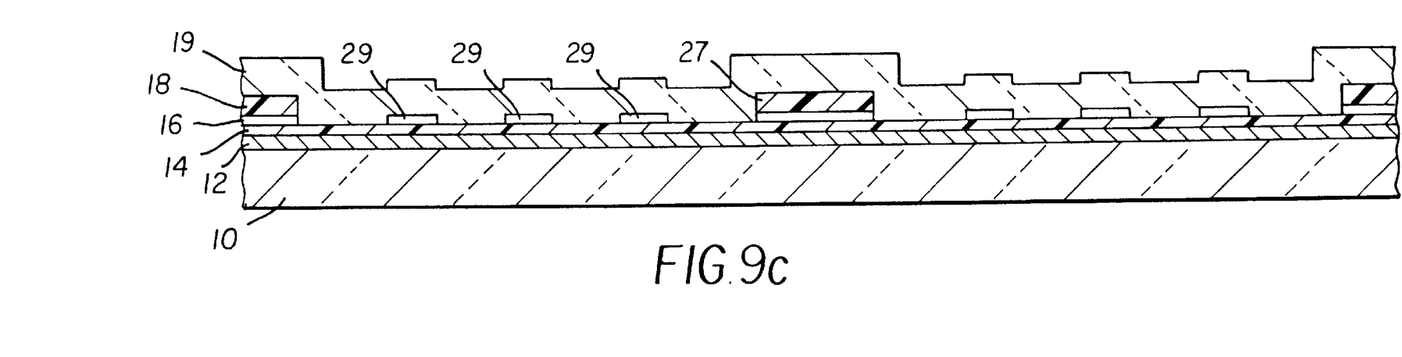
FIG. 9c is a cross-sectional view through line 3—3 in FIG. 7 illustrating deposition of a sacrificial layer.

FIG. 9c, a cross-sectional view along line 3—3 indicated in FIG. 7, illustrates the deposition of a sacrificial layer 19. To allow additional layers atop the existing structure, as shown in FIG. 9c, a conformal sacrificial layer 19 is deposited to a thickness greater than the sum of the thickness of the standoff layer 16 and the spacer layer 18. The material for the sacrificial layer 19 is different from the spacer layer 18 and is selected from the group consisting of silicon oxide, silicon nitride, polysilicon, doped-polysilicon, silicon-germanium alloys and polyimide. In a preferred embodiment, the sacrificial layer 19 is polysilicon deposited by chemical vapor deposition.

Figure 9D:
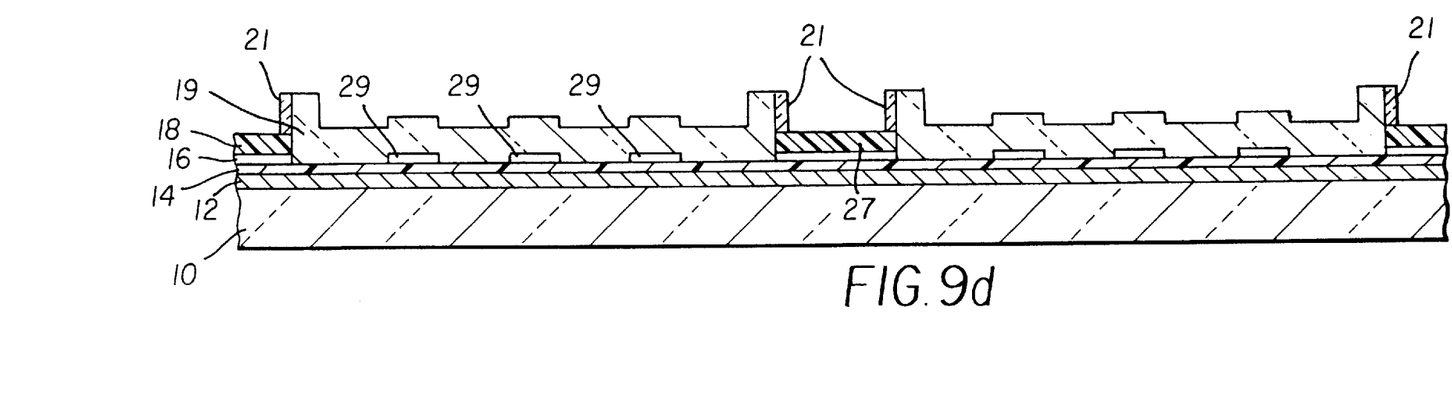
FIG. 9d is a cross-sectional view through line 3—3 in FIG. 7 illustrating patterning of the sacrificial layer.

FIG. 9d, a cross-sectional view along line 3—3 indicated in FIG. 7, illustrates the patterning of the sacrificial layer 19. The patterning of the sacrificial layer 19 is carried out using standard photolithographic processing and a mask (not shown), which is the reverse of the mask used to etch the spacer layer 18, defining the active region 8 where the channels 25 and intermediate supports 27 are located. The reversal mask (not shown) can be biased to provide overlap 21 to account for misalignment. The sacrificial layer is then completely removed from the areas defined by the reversal mask. The patterning of the sacrificial layer is designed to minimize the width of overlaps 21 in order to maximize the degree of planarization achieved with the chemical mechanical polishing step described below. The removal of the sacrificial layer outside of the active region 8 improves the uniformity of the planarization step described below. This removal process also ensures a good mechanical attachment or adhesion of the elongated ribbon elements 23a–23d to the intermediate supports 27 and the end supports 24a and 25b (not shown in FIG. 9d).

Figure 9E:
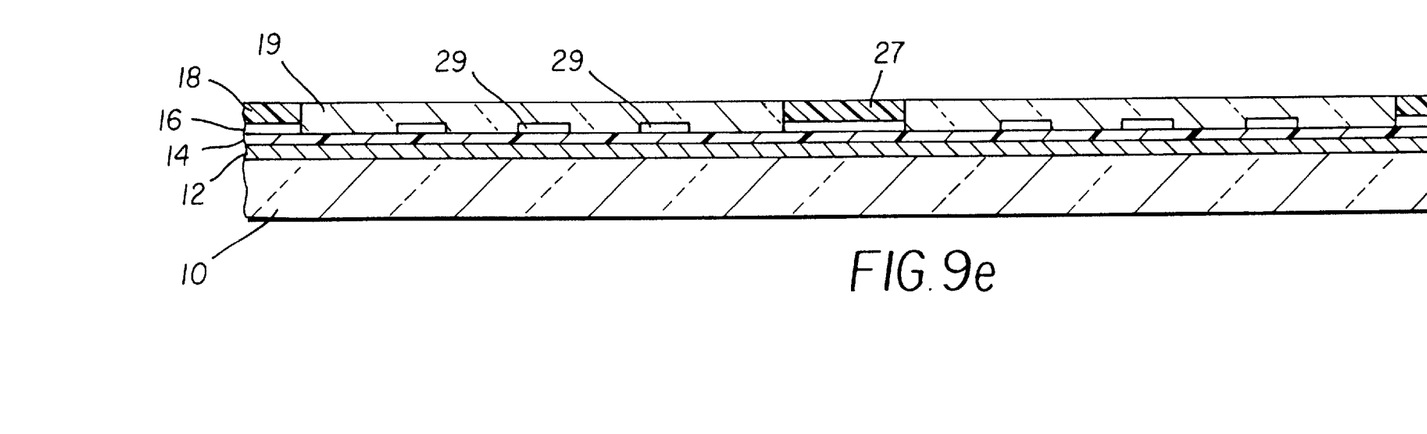
FIG. 9e is a cross-sectional view through line 3—3 in FIG. 7 illustrating planarizing of the sacrificial layer.

FIG. 9e, a cross-sectional view along line 3—3 indicated in FIG. 7, illustrates the planarization of the sacrificial layer 19. Chemical mechanical polishing methods are used to achieve the polished structure. The polished surface of sacrificial layer 19 filling the channels 25 is preferably polished to be optically planar with the top surface of the intermediate supports 27, but need not have optical planarity with end supports 24a and 24b. One reason for the requirement of optical planarity for the intermediate supports 27 and not the end supports 24a and 24b, is because the intermediate supports 27 are critically functional to the optical efficiency of the device. In other words, the elongated ribbon element 23b deforms around the intermediate supports 27 to produce a partially conformal grating having period Λ.

Figure 9F:
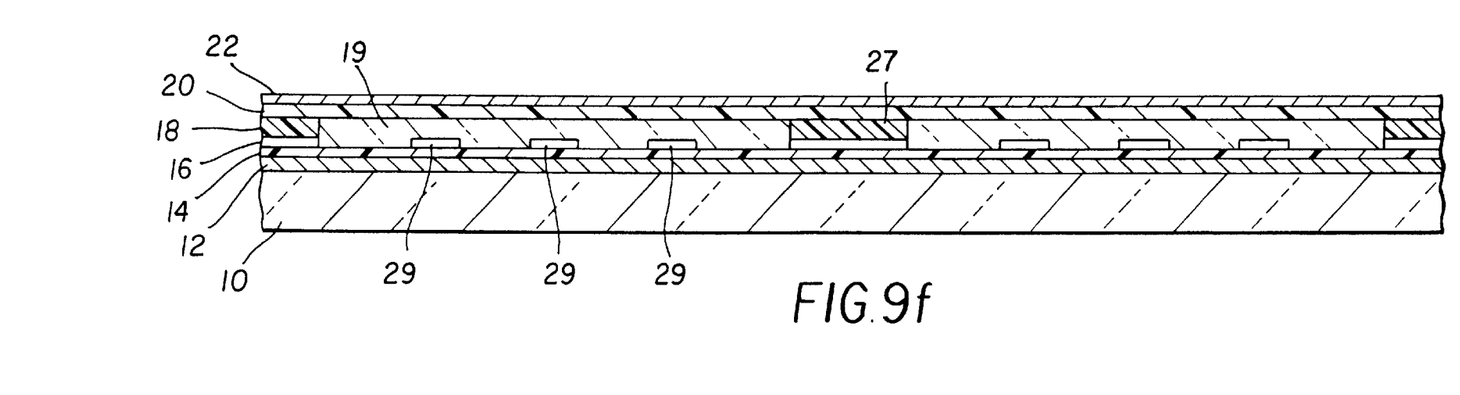
FIG. 9f is a cross-sectional view through line 3—3 in FIG. 7 illustrating deposition of a ribbon layer and a reflective and conductive layer.

As is well known in the practice of optical engineering, optical planarity requires a surface planarity of less than about 200 Angstrom units at visible wavelengths. FIG. 9f, is a cross-sectional view, along line 3—3 indicated in FIG. 7, and illustrates deposition of the ribbon layer 20 and the reflective and conductive layer 22. The ribbon layer 20 is deposited on top of the optically planar sacrificial layer 19 and intermediate supports 27, thereby covering the entire active region 8 of the device. Silicon nitride is a well-suited material for the ribbon layer 20 and can be patterned to provide the mechanical structure. Silicon nitride's material properties are well suited for the application because of the intrinsic and controllable tensile stress during the deposition process. The reflective and conductive layer 22 deposited atop the ribbon layer 20 requires good electrical conducting properties.

The elongated ribbon elements 23a–23d are patterned from the ribbon layer 20 and the reflective and conductive layer 22 using photolithographic processing and etching. This etching process defines the top-view geometry of the elongated ribbon elements 23a–23d as shown in FIGS. 6 and 7.

Figure 9G:
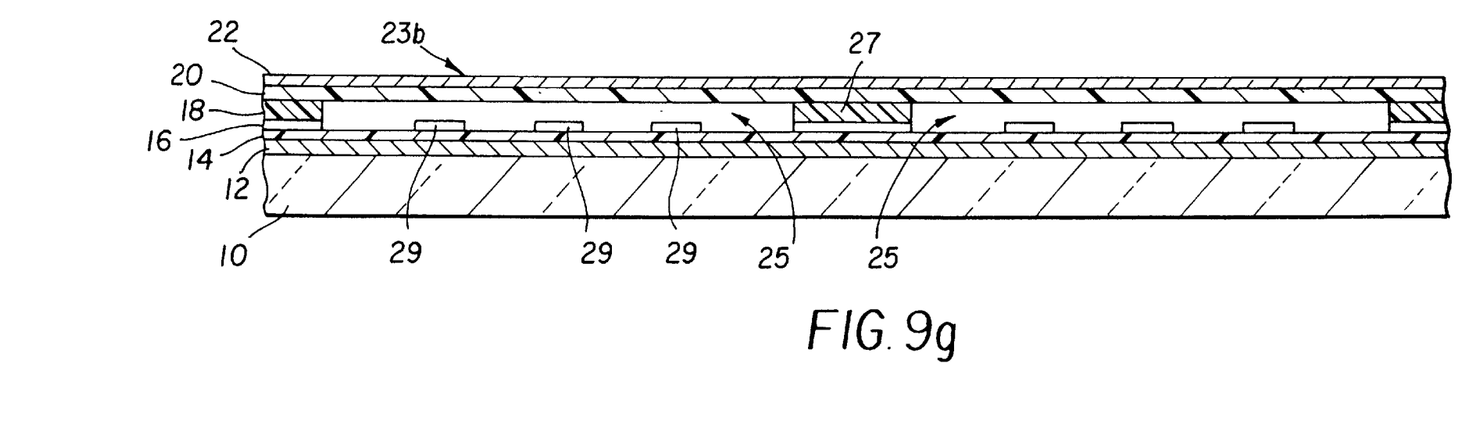
FIG. 9g is a cross-sectional view through line 3—3 in FIG. 7 illustrating removal of the sacrificial layer after patterning elongated ribbon elements.

FIG. 9g, a cross-sectional view along line 3—3 indicated in FIG. 7, illustrates the removal of the sacrificial layer 19 from within the active region 8 to form channels 25 and intermediate supports 27. In a preferred embodiment, the sacrificial layer 19 is polysilicon that can be selectively removed with dry etching methods to yield the cross-sectional view illustrated in FIG. 9g. The etchant has access to the sacrificial layer 19 through the gaps 28 as shown in FIG. 7 between the elongated ribbon elements 23a–23d. The complete removal of the sacrificial layer 19 is the final step required to produce operational conformal grating devices 5a–5d. Upon the complete removal of the sacrificial layer 19, the devices can be actuated to operate as described earlier. More importantly, after completely removing the sacrificial layer 19, the elongated ribbon elements 23a–23d remain optically planar on both their bottom and top surfaces subject to the ribbon layer 20 having been deposited with uniform thickness and uniform tensile stress. Optically planar free-standing structures may also be produced with a similar method or process. One should note that an optical device may be in direct contact with support structures.

Figure 10:
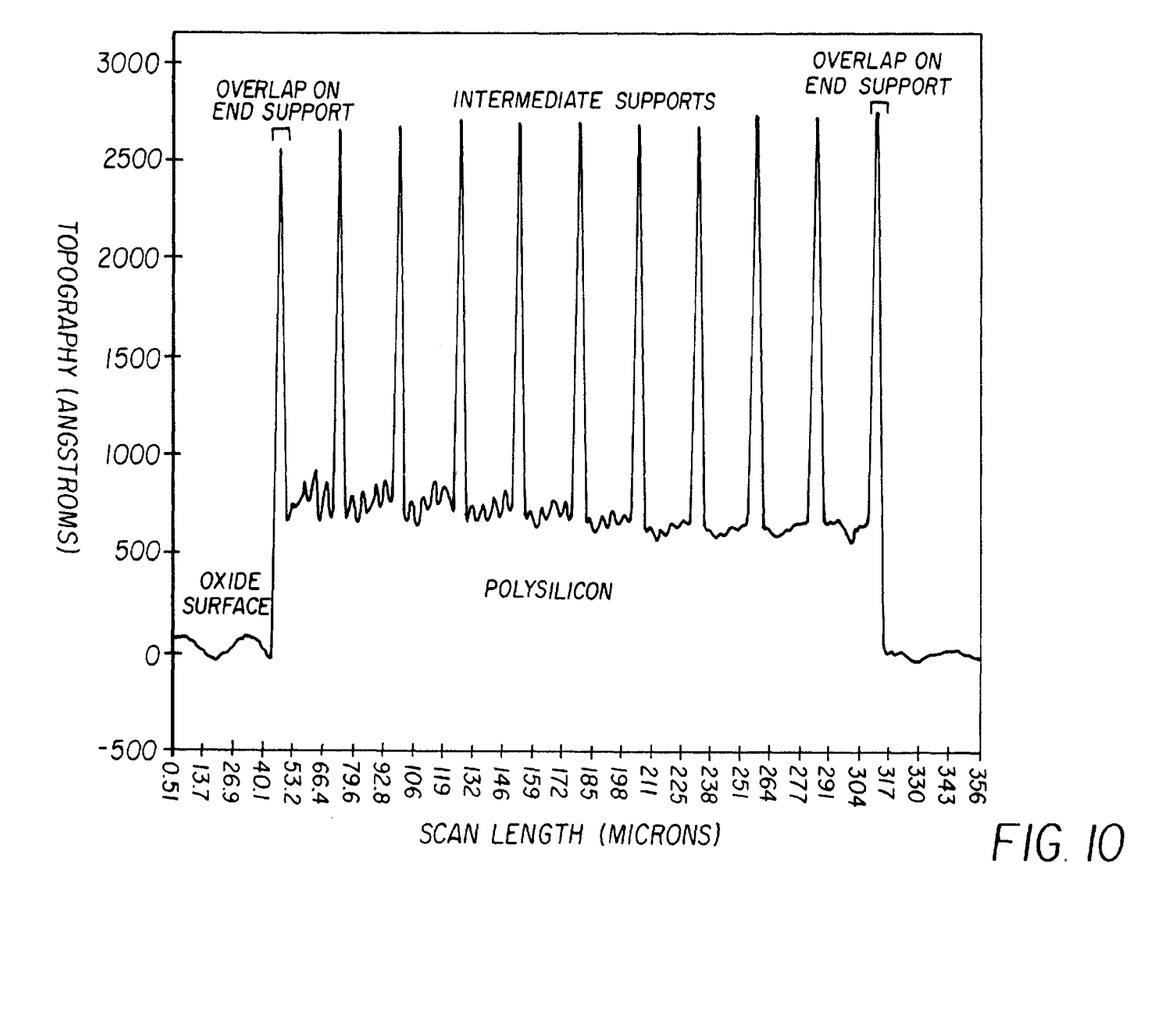
FIG. 10 shows a profilometer trace after the etching of the sacrificial layer as disclosed in FIG. 9d.
Figure 11:
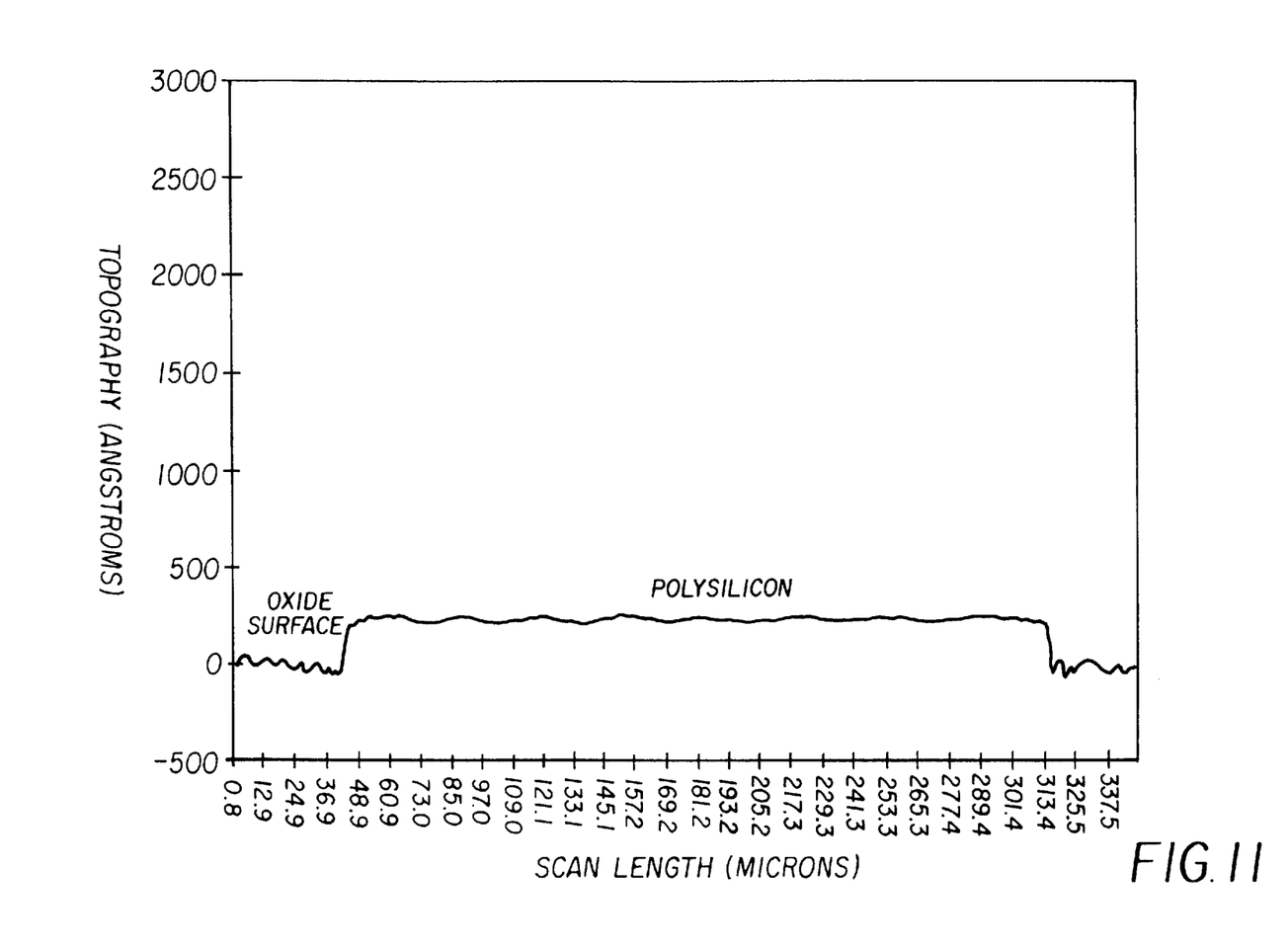
FIG. 11 shows a profilometer trace after the CMP process of the sacrificial layer as disclosed in FIG. 9d.

FIGS. 10–11 illustrate the surface quality achieved with the inventive method. The layer structure, used for the topography results, is comparable to the structure as shown in FIGS. 9a–9e. FIG. 10 shows a surface profilometer trace after the sacrificial layer 19 has been patterned and the etch mask removed. Regarding FIG. 10, the end supports 24a and 24b are clear of any sacrificial layer 19; in contrast, the sacrificial layer 19 covers the intermediate supports 27 and channel 25. The period between intermediate supports 27 is 25 microns. The intermediate supports 27 are 2 microns wide. After CMP, a surface profilometer trace of the same surface is displayed in FIG. 11. Regarding FIG. 11, the sacrificial layer 19 has been polished to a planar surface that is not co-planar with the end supports 24a and 24b, but is optically planar to the intermediate support 27 and channel regions 25 of the device 5a. The surface of the sacrificial layer 19 is within 200 Å of the oxide surface 16 with a planarity of less than 50 Å

The invention has been described in detail with particular reference to certain preferred embodiments thereof, but it will be understood that variations and modifications can be effected within the spirit and scope of the invention.

Parts List 5a conformal grating device
5b conformal grating device
5c conformal grating device
5d conformal grating device
8 active region
10 substrate
12 bottom conductive layer
14 protective layer
16 standoff layer
18 spacerlayer
19 sacrificial layer
20 ribbon layer
21 sacrificial layer overlap
22 reflective and conductive layer
23a elongated ribbon element
23b elongated ribbon element
23c elongated ribbon element
23d elongated ribbon element
24a end support
24b end support
25 channel
27 intermediate support
28 gap
29 standoff
30 incident light beam
32 reflected light beam
35a +$1^{st}$ order beam
35b −$1^{st}$ order beam
36a +$2^{nd}$ order beam
36b −$2^{nd}$ order beam
100 substrate
110 narrow recess
120 wide recess
130 small area between recesses
140 large area between recesses
150 first layer
160 blanket conformal fill layer
170 planarized filled wide recess
180 planarized filled narrow recess
190 fill residue layer
200 first layer
220 substrate
238 overlap regions
240 first channel
260 surface of first layer
280 second layer
300 conformed channel
320 second layer overlap
340 polished second layer top surface

What is claimed is:

1. A method for producing optically planar surfaces for micro-electromechanical system devices (MEMS), comprising the steps of:
   a) depositing a first layer over a substrate;
   b) forming a channel in the first layer wherein the channel has a depth defined by thickness of the first layer and a width greater than 10 microns, and has standoffs;
   c) depositing a second layer over the first layer wherein the second layer has a thickness greater than the depth of the channel and is composed of a different material than the first layer;
   d) removing the second layer from outside the channel leaving an overlap at the edge of the channel; and
   e) polishing the second layer that fills the channel and any overlap of the second layer to obtain an optically planar surface for the MEMS device.

2. The method as claimed in claim 1 wherein a complete removal of the second layer is done such that there remains an overlap of the second layer with the first layer beyond the channel.

3. The method as claimed in claim 2 wherein the overlap of the second layer with the first layer beyond the channel is less than 2 microns.

4. The method as claimed in claim 1 wherein the step of removing the second layer comprises:
   a) protecting a portion of the second layer from subsequent etching, with an etch mask;
   b) completely etching an unprotected area of the second layer to expose the first layer; and
   c) removing the etch mask.

5. The method as claimed in claim 1 wherein the step of polishing the second layer that fills the channel and any overlap of the second layer is done by chemical-mechanical polishing.

6. The method as claimed in claim 1 wherein the first layer is silicon dioxide.

7. The method as claimed in claim 1 wherein the second layer is polysilicon.

8. The method as claimed in claim 1 wherein the second layer is polyimide.

9. The method as claimed in claim 1 wherein the width of the channel is between 10 and 200 microns.

10. A method for producing optically planar free-standing structures, comprising the steps of:
   a) depositing a first layer having a channel over a substrate wherein the channel has a depth defined by thickness of the first layer and any subsequent layers, and a width greater than 10 microns;

b) depositing a sacrificial second layer over the first layer wherein the sacrificial second layer has a thickness greater than the depth of the channel and is composed of a differing material to the first layer;

c) removing the sacrificial second layer outside the area of the channel, including any support region of a free-standing structure, and leaving an overlap at the edge of the at least one channel;

d) polishing the second layer that fills the channel and any overlap of the second layer to obtain an optically planar surface for the MEMS device;

e) building an optical device on top of the optically planar surface; and f) completely removing any remaining sacrificial layer within the channel so that the optical device becomes an optically planar free-standing structure.

11. A method as claimed in claim 10 wherein the optically planar free-standing structure is a micro-electromechanical structure.

12. The method as claimed in claim 10 wherein the removing of the second layer is done such that there is overlap of the second layer with the first layer beyond the channel.

13. The method as claimed in claim 10 wherein the overlap of the second layer with the first layer beyond the channel is less than 2 microns.

14. The method as claimed in claim 10 wherein the step of removing the second layer comprises:

a) providing an etch mask to protect the material of the second layer within the area of the channel;

b) completely etching the area of the second layer unprotected by the etch mask to expose the first layer; and c) removing the etch mask.

15. The method as claimed in claim 10 wherein the step of polishing the second layer that fills the channel and any overlap of the second layer is done by chemical-mechanical polishing.

16. The method as claimed in claim 10 wherein the first layer is silicon dioxide.

17. The method as claimed in claim 10 wherein the second layer is polysilicon.

18. The method as claimed in claim 10 wherein the second layer is polyimide.

19. The method as claimed in claim 10 wherein the width of the channel is between 10 and 200 microns.

20. The method as claimed in claim 10 wherein the channel has standoffs.

21. A method for producing optically planar free-standing structures, comprising the steps of:

a) providing a first layer with a least two channels containing at least one intermediate support over a substrate wherein said channels have a depth defined by the thickness of the first layer, and a width greater than 10 microns;

b) depositing a sacrificial second layer over the entire area of the first layer wherein the sacrificial second layer has a thickness greater than the depth of the channels and is composed of a differing material to the first layer;

c) removing the sacrificial second layer outside the area of at least two channels, including any intermediate support regions, and leaving an overlap at the edges of the at least two channels;

d) polishing the sacrificial second layer within at least two channels and any overlap of the second layer to obtain an optically planar surface;

e) building an optical device on top of the optically planar surface; and f) completely removing any remaining sacrificial layer within the at least two channels so that the optical device becomes an optically planar free-standing structure.

22. A method as claimed in claim 21 wherein the optically planar free-standing structure is a micro-electromechanical structure.

23. The method as claimed in claim 21 wherein the removing of the second layer is done such that there is overlap of the second layer with the first layer beyond the channel.

24. The method as claimed in claim 21 wherein the overlap of the second layer with the first layer beyond the channel is less than 2 microns.

25. The method as claimed in claim 21 wherein the step of removing the second layer comprises:

a) providing an etch mask to protect the material of the second layer within the area of the channel;

b) completely etching the area of the second layer unprotected by the etch mask to expose the first layer; and c) removing the etch mask.

26. The method as claimed in claim 21 wherein the step of polishing the second layer that fills the channels and any overlap of the second layer is done by chemical-mechanical polishing.

27. The method as claimed in claim 21 wherein the first layer is silicon dioxide.

28. The method as claimed in claim 21 wherein the second layer is polysilicon.

29. The method as claimed in claim 21 wherein the second layer is polyimide.

30. The method as claimed in claim 21 wherein the width of the channel is between 10 and 200 microns.

* * * * *